(12) United States Patent
Jeon

(10) Patent No.: US 7,612,395 B2
(45) Date of Patent: Nov. 3, 2009

(54) CMOS IMAGE SENSORS

(75) Inventor: In Gyun Jeon, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/441,295

(22) Filed: May 24, 2006

(65) Prior Publication Data

US 2006/0208259 A1    Sep. 21, 2006

Related U.S. Application Data

(62) Division of application No. 10/970,347, filed on Oct. 21, 2004, now Pat. No. 7,078,260.

(30) Foreign Application Priority Data

Dec. 31, 2003  (KR) .............................. 2003-101545
Aug. 12, 2004  (KR) ............................... 2004-63466

(51) Int. Cl.
   *H01L 31/113*  (2006.01)

(52) U.S. Cl. ................ 257/292; 257/432; 257/E31.127
(58) Field of Classification Search ................. 257/292, 257/432, E31.127
See application file for complete search history.

(56) References Cited

U.S. PATENT DOCUMENTS

| 6,221,687 B1 * | 4/2001 | Abramovich ................. 438/70 |
| 6,274,917 B1 * | 8/2001 | Fan et al. ..................... 257/432 |
| 6,362,513 B2 * | 3/2002 | Wester ........................ 257/432 |
| 2002/0017655 A1 * | 2/2002 | Fujisawa et al. ............ 257/184 |

FOREIGN PATENT DOCUMENTS

JP          2003204050       *  7/2003

* cited by examiner

*Primary Examiner*—Samuel A Gebremariam
(74) *Attorney, Agent, or Firm*—The Law Offices of Andrew D. Fortney; Andrew D. Fortney; William K. Nelson

(57) ABSTRACT

CMOS image sensors and methods for fabricating the same are disclosed. A disclosed CMOS image sensor comprises: a semiconductor substrate; a photo diode; a microlens located over the photo diode; and a color filter layer located over the microlens.

20 Claims, 14 Drawing Sheets

CMOS IMAGE SENSORS

RELATED APPLICATIONS

This application is a divisional of U.S. application Ser. No. 10/970,347, filed Oct. 21, 2004 now U.S. Pat. No. 7,078,260.

FIELD OF THE DISCLOSURE

The present disclosure relates generally to image sensors and, more particularly, to CMOS image sensors and methods for fabricating the same.

BACKGROUND

Image sensors are semiconductor devices for converting an optical image into an electric signal. In general, an image sensors is either a charge coupled devices (CCD) or a CMOS (Complementary Metal Oxide Silicon) image sensor.

The charge coupled device (CCD) is provided with a matrix of photo diodes (PD). Each photo diode converts an optical signal into an electric signal. The CCD also includes a plurality of vertical charge coupled devices (VCCD). Each of the VCCDs is formed between vertical lines of the photo diodes in the matrix for transmission of charges generated at the photo diodes in a vertical direction. The CCD also includes a horizontal charge coupled device (HCCD) for transmission of the charges transmitted through the VCCDs in a horizontal direction. In addition, the CCD includes a sense amplifier for sensing the charges transmitted in the horizontal direction and outputting an electric signal.

However, the CCD is disadvantageous in that it has a complicated driving method, exhibits high power consumption, and is produced via a complicate fabrication process involving multiple photo process stages. Moreover, CCDs have another disadvantage in that it is difficult to include a CCD in a small product due to the difficulty in integrating a control circuit, a signal processing circuit, an A/D converter, and the like on a CCD chip.

Recently, the CMOS sensor has been heralded as the next generation image sensor that can overcome the disadvantages of CCDs. The CMOS image sensor is a device that employs CMOS technology to capture an image. Specifically, a control circuit, a signal processing circuit, and the like are used as peripheral circuits for successively detecting outputs from pixels using MOS transistors. A MOS transistor is formed on the semiconductor substrate for each pixel. That is, the CMOS image sensor has a photo diode and a MOS transistor formed within each unit pixel. By monitoring the switching of the MOS transistors, the CMOS image sensor successively detects electric signals from the photo diodes of the unit pixels to reproduce an image.

The CMOS image sensor exhibits low power consumption and enjoys a simple fabrication process as a result of fewer photo process stages. Moreover, the CMOS image sensor is advantageous in that products incorporating the CMOS image sensor can easily be made smaller because a control circuit, a signal processing circuit, an A/D converter, and the like can be integrated on a CMOS image sensor chip. Accordingly, the CMOS image sensor has a wide range of applications, such as in a digital still camera, in digital video cameras, and the like.

A prior art CMOS image sensor will now be described with reference to the attached drawings. FIG. 1 illustrates a circuit equivalent to one pixel of a prior art CMOS image sensor. FIG. 2 is a cross-sectional view of the prior art CMOS image sensor.

Referring to FIG. 1, the pixel unit of the prior art CMOS image sensor is provided with one photo diode (PD), and three NMOS transistors T1, T2, and T3. The photo diode PD has a cathode connected to both a drain of the first NMOS transistor T1 and a gate of the second NMOS transistor T2. Both the first and the second NMOS transistors T1, T2 have sources connected to a power source providing a reference voltage VR. The first NMOS transistor T1 has a gate connected to a reset line providing a reset signal RST. The third NMOS transistor T3 has a source connected to the drain of the second NMOS transistor. It also has a drain connected to a reading circuit (not shown) via a signal line, and a gate connected to a row selection line providing a selection signal SLCT. The first NMOS transistor T1 is called a reset transistor, the second NMOS transistor T2 is called a drive transistor, and the third NMOS transistor T3 is called a selection transistor.

The greater the light reception of the photo diode PD, the better the photosensitivity of the image sensor. Consequently, there have been efforts to increase the ratio of an area of the photo diode to the entire area of the image sensor, (i.e., to increase a fill factor), to thereby enhance the photosensitivity of the image sensor. However, since elimination of a logic circuit having transistors and the like from the CMOS image sensor is basically impossible, efforts to increase the fill factor have been inherently limited, because the fill factor may only be increased within a limited area.

Faced with such a problem, focusing technology has been suggested for enhancing the photosensitivity of the photo diode. In such approaches, the paths of light rays incident on regions other than the photo diode PD are changed, so that the light rays are focused onto the photo diode PD. A common approach to re-focusing light rays in this manner is microlens forming technology.

Referring to FIG. 2, a prior art CMOS image sensor having a microlens is shown. The image sensor of FIG. 2 is provided with a semiconductor substrate 101 having one or more active region(s) defined by one or more device isolating film(s) 102, one or more photo diode(s) 103 formed on predetermined portion(s) of the active region(s), and an interlayer insulating film 104 located on the surface of the device isolating film(s) 102 and on the surface of the photo diode(s) 103. Although not shown in FIG. 2, the interlayer insulating film 104 includes light shielding layer(s) at predetermined location(s) to prevent light from reaching regions other than the photo diode region(s) 103.

Color filter layer(s) 105 for transmitting light of a particular wavelength to corresponding ones of the photo diode(s) 103 are located on the interlayer insulating film 104 over their respective photo diode(s) 103. An over coat layer 106 is located on the interlayer insulating film 104 and on the color filter layer(s) 105. One or more microlens 107 for focusing light are located on the over coat layer 106 over the photo diode(s) 103.

Each microlens 107 refracts light running parallel to a light axis of the microlens 107 to a focal point on the light axis. Since each image sensor has tens of thousands of microlenses 107, the microlenses 107 must provide the same effect to produce a clear image. Thus, the performances of the microlenses 107 are so important that the quality of the CMOS image sensor is dependent thereon.

A method for fabricating the microlenses 107 of the prior art CMOS image sensor will now be described. FIGS. 3A to 3D are cross-sectional views illustrating a prior art microlens at various stages of fabrication.

As described with reference to FIG. 2, an over coat layer 106 is formed on the entire surface of the interlayer insulating film 104 and the color filter layer(s) 105 formed thereon. Then, as shown in FIG. 3A, a photoresist film 107 is coated on the over coat layer 106.

Referring to FIG. 3B, the photoresist film 107 is selectively patterned by photolithography to form a plurality of microlens unit patterns on the over coat layer 107. The microlens unit patterns are located over the photo diodes 103. Referring to FIG. 3C, the photoresist film 107 is baked at a temperature of about 150° C. to melt the microlens unit patterns to form convex microlenses 107a.

The above process of fabricating microlenses of a CMOS image sensor is simplified by the fact that the microlens is formed of a material which is identical to the photoresist film. However, the prior art CMOS image sensor and method for fabricating the same have certain disadvantages.

For example, it is necessary to form the microlenses 107 in a last phase of the fabrication process because the microlens is formed of the photoresist material, which has a low melting point. As a result, the color filter layer(s) 105, the interlayer insulating film 104, and the over coat layer 106 separate the microlenses 107 from their respective photo diodes 103 by a significant distance, thereby resulting in poor focusing power of the microlenses 107.

Further, it is difficult to control the radius of curvature of the microlenses 107, and to form uniform microlenses 107 on the whole, because the microlenses 107 are formed by baking the photoresist pattern.

BRIEF DESCRIPTION OF THE DRAWINGS

Wherever possible, the same reference numbers will be used throughout the drawings to refer to the same or like parts.

DETAILED DESCRIPTION

Figure 1:
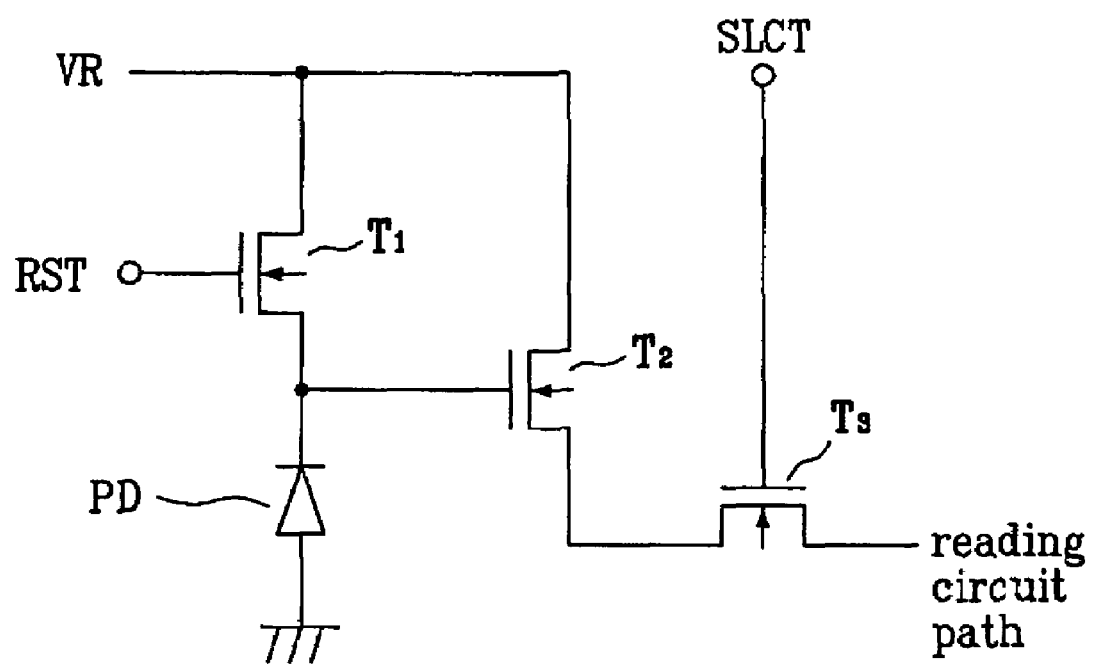
FIG. 1 illustrates a circuit equivalent to one pixel of a prior art CMOS image sensor.
Figure 2:
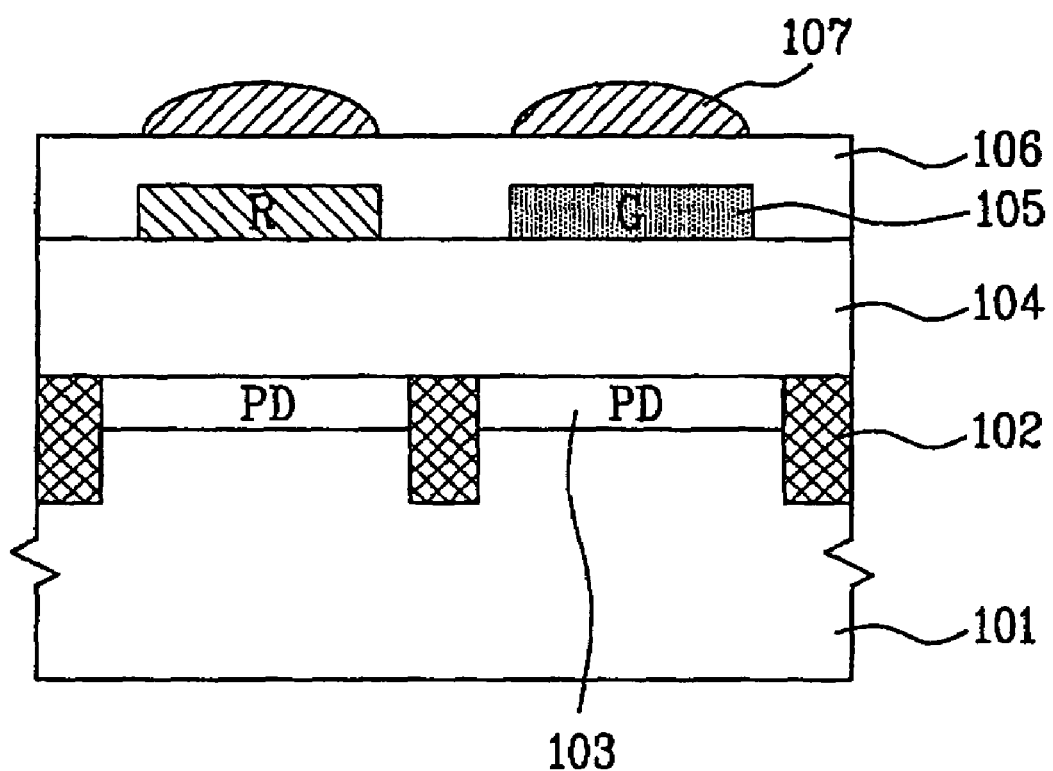
FIG. 2 is a cross-sectional view of a prior art CMOS image sensor.
Figure 3A:
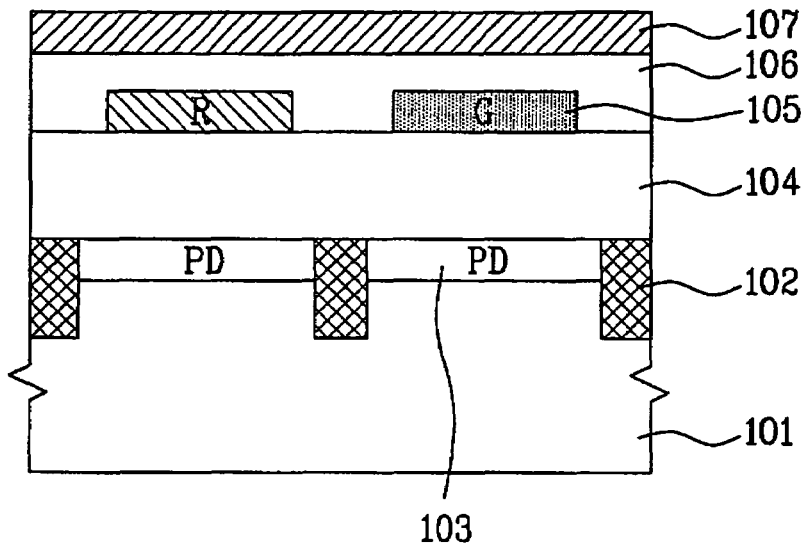
FIGS. 3A to 3C are cross-sectional views illustrating a prior art method for fabricating a microlens.
Figure 3B:
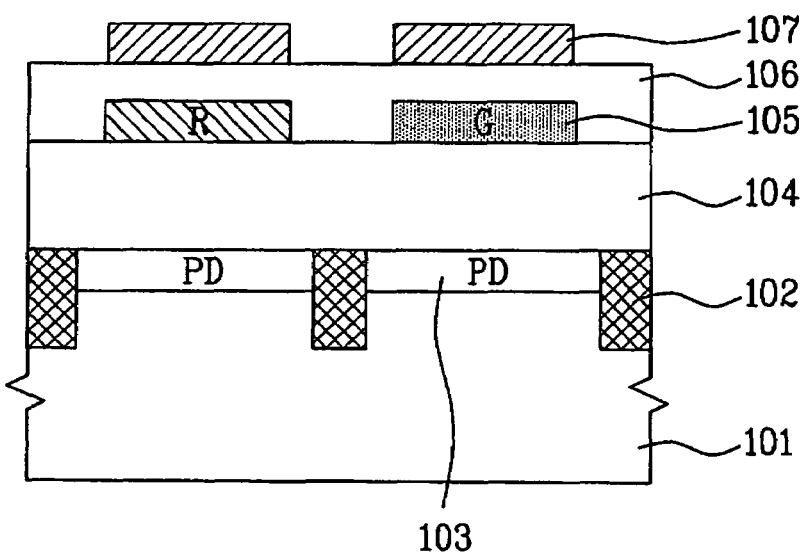
Figure 3C:
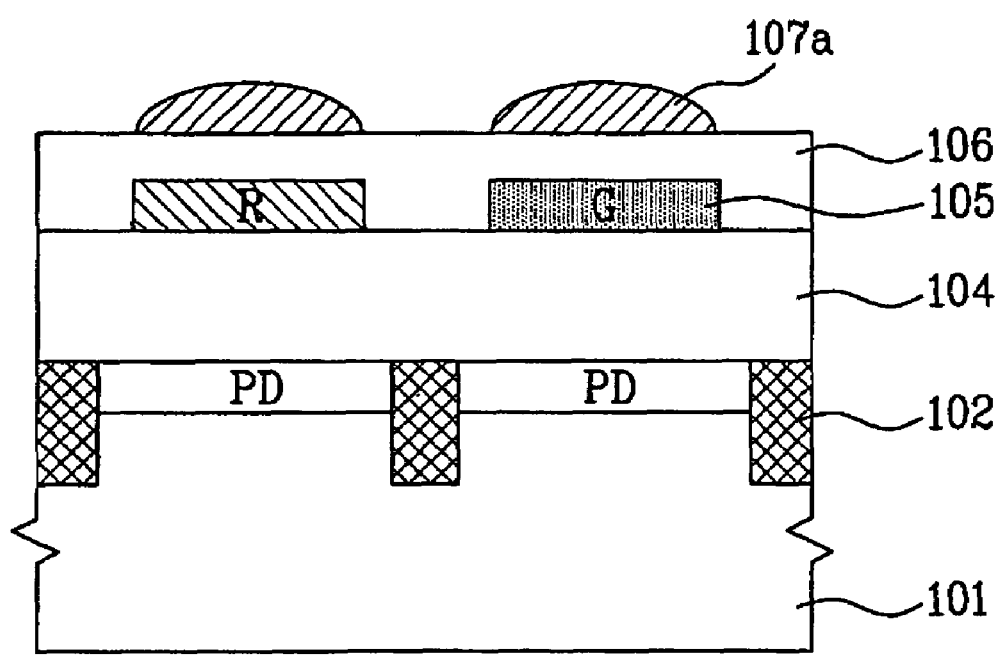
Figure 4:
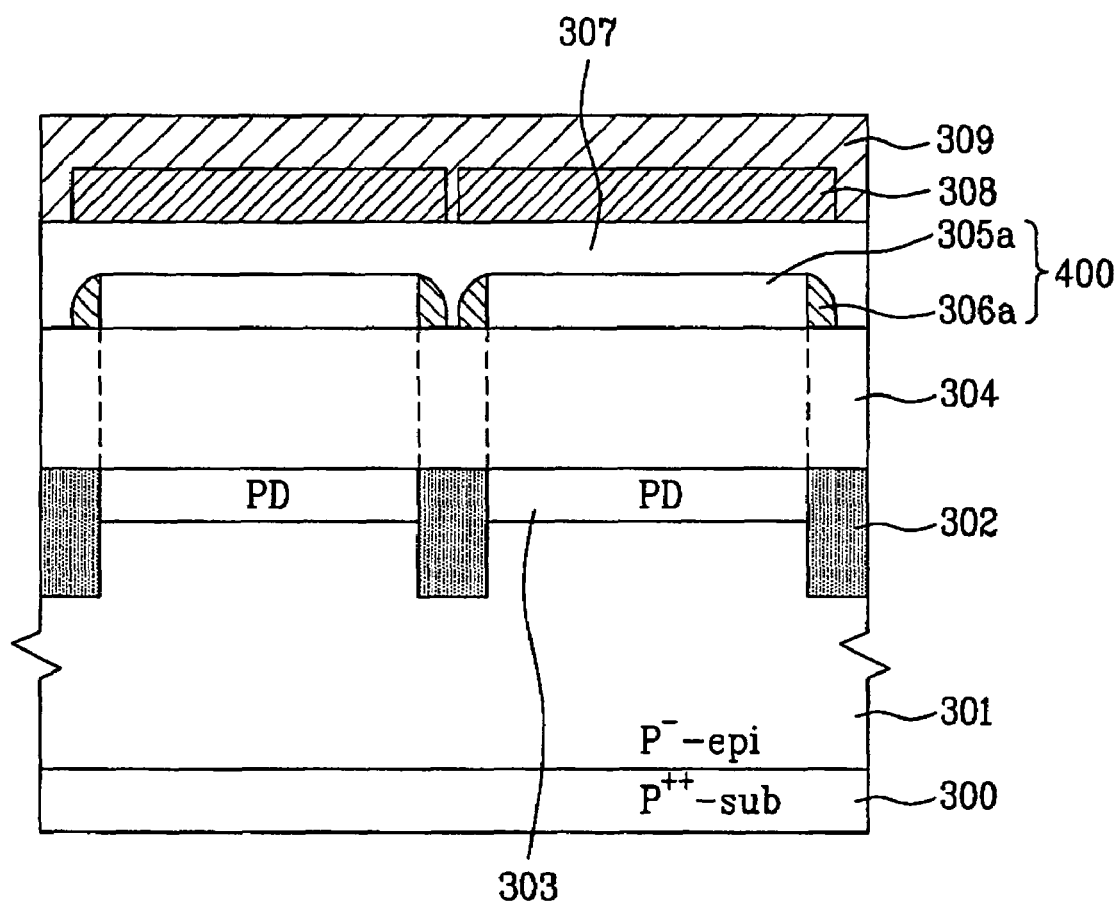
FIG. 4 is a cross-sectional view of an example CMOS image sensor constructed in accordance with the teachings of the present invention.

FIG. 4 is a cross-sectional view of an example CMOS image sensor constructed in accordance with the teachings of the present invention. FIGS. 5A to 5D are cross-sectional views illustrating an example method of fabricating the CMOS image sensor of FIG. 4.

Referring to FIG. 4, the illustrated CMOS image sensor includes one or more active region(s) defined by one or more device isolating film(s) 302. The image sensor includes a P type semiconductor substrate 300 having a P type epitaxial layer 301 formed therein. One or more light receiving devices (e.g., photodiode(s) 303), are formed on predetermined region(s) of the active region(s).

An interlayer insulating film 304 is formed on the entire surface of the epitaxial layer 301 of the semiconductor substrate 300. In other words, the interlayer insulating film 304 is formed over the photo diode(s) 303 and device isolating film (s) 302. One or more microlenses 400 having a first dielectric film pattern 305a and a second dielectric film pattern 306a are formed on the interlayer insulating film 304.

In the illustrated example, the first dielectric film pattern 305a has the identical area and shape as the photo diode 303. The second dielectric film pattern 306a is located at the sides of the first dielectric film pattern 305a and has the shape of sidewall spacers. The second dielectric film pattern 306a is formed of a material having a higher index of refraction than the first dielectric film pattern 305a. Since the spacer shaped second dielectric film pattern 306a has a higher refractive index than the first dielectric film pattern 305a, and surrounds the photo diode 303, the second dielectric film pattern 306a enables the microlens 400 to collect more light, thereby improving its light focusing power.

A third dielectric film 307 is formed on the first dielectric film pattern 305a and the second dielectric film pattern 306a. It is preferable that the third dielectric film 307 has substantially the same an index of refraction as the first dielectric film pattern 305a.

One or more color filter layer(s) 308 are formed on the third dielectric film 307 above respective ones of the photo diode(s) 303. An over coat layer 309 is formed on the resulting structure including on the color filter layer(s) 308 and any exposed surfaces of the third dielectric film 307.

Figure 5A:
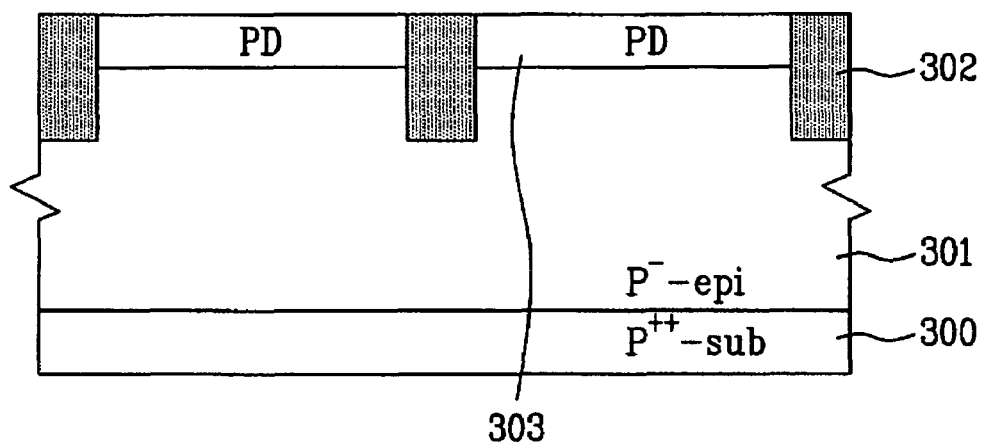
FIGS. 5A to 5D are cross-sectional views illustrating an example method for fabricating a CMOS image sensor performed in accordance with teachings of the present invention.

A method of fabricating the CMOS image sensor of FIG. 4 will now be described. Referring to FIG. 5A, a semiconductor substrate 300 (for example, a p type single crystal silicon substrate) is provided. A p type epitaxial layer 301 is formed on the semiconductor substrate 300.

The p type epitaxial layer 301 will form large and deep depletion regions in low voltage photo diode(s) to be formed later, so as to enhance the capability of the photo diode(s) 303 to collect photo-charges, and, thus, improving the photo sensitivity of the photo diode(s).

Next, active region(s) and field region(s) are defined on the epitaxial layer 301 by forming device isolating films 302. 'N' type impurity ions are injected into predetermined portion(s) of the epitaxial layer 301 in the active region(s), to form the photo diode(s) 303.

An interlayer insulating film 304 is formed on the entire surface of the epitaxial layer 301 including on the photo diode(s) 303 and the device isolating films 302. Although not shown, a light shielding layer may then be formed on the interlayer insulating film 304 to prevent light from reaching regions other than the photo diode(s) 303. The interlayer insulating film 304 is a dielectric film comprising a general widely used oxide. The other dielectric materials have similar indices of refraction.

Figure 5B:
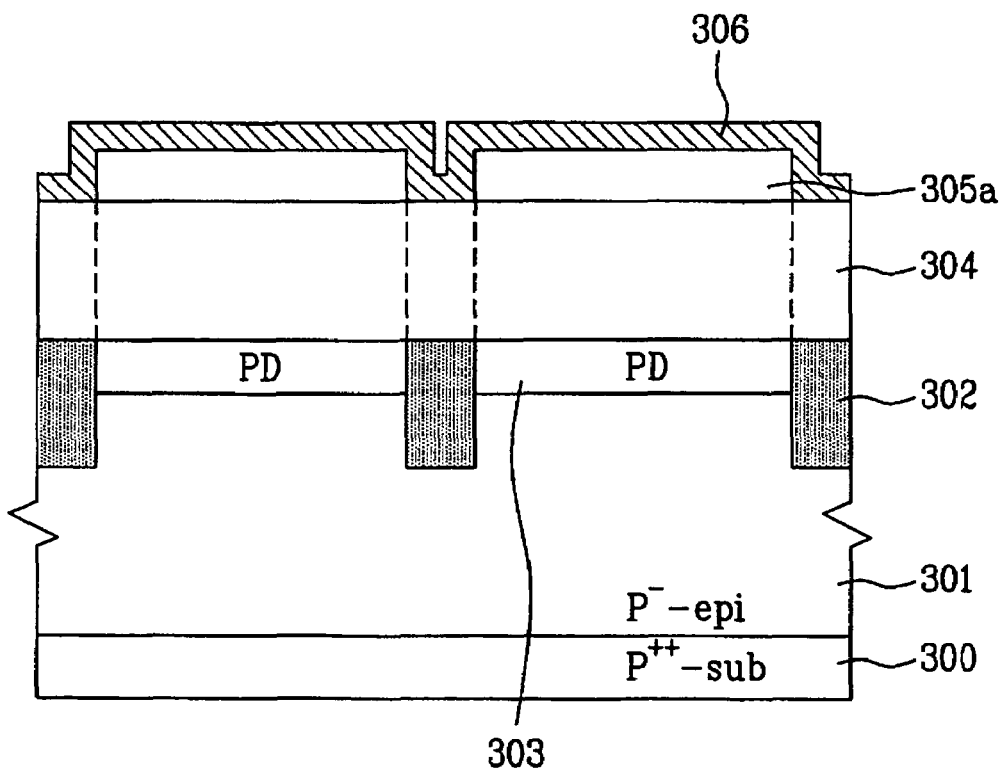

Referring to FIG. 5B, a first dielectric film 305a is formed on the interlayer insulating film 304. The first dielectric film has a thickness in a range of about 5000~15000 Å. It is preferable that the first dielectric film 305a is formed of an oxide. Then, the first dielectric film 305a is selectively patterned by photolithography and etching to form a plurality of dielectric film patterns 305a on the interlayer insulating film 304 over the photo diodes 303. That is, the first dielectric film patterns 305a are formed such that the first dielectric film 305a remains on regions over the photo diodes 303, while the other portions of the first dielectric film 305a are removed. In the illustrated example, each first dielectric film pattern 305a has substantially the same area as its corresponding photo diode 303. More specifically, it is preferable that each of the first dielectric film patterns 305a has a width in a range of about 0.5~2 μm.

Next, a second dielectric film 306 is formed on the entire surface of the resulting structure including on the first dielectric film(s) 305a to a thickness in a range of about 5000~15000 Å. The second dielectric film 306 is formed of a material having a greater index of refraction than the first dielectric film(s) 305a. It is preferable that the second dielectric film 306 is formed of a nitride if the first dielectric film is formed of an oxide.

Figure 5C:
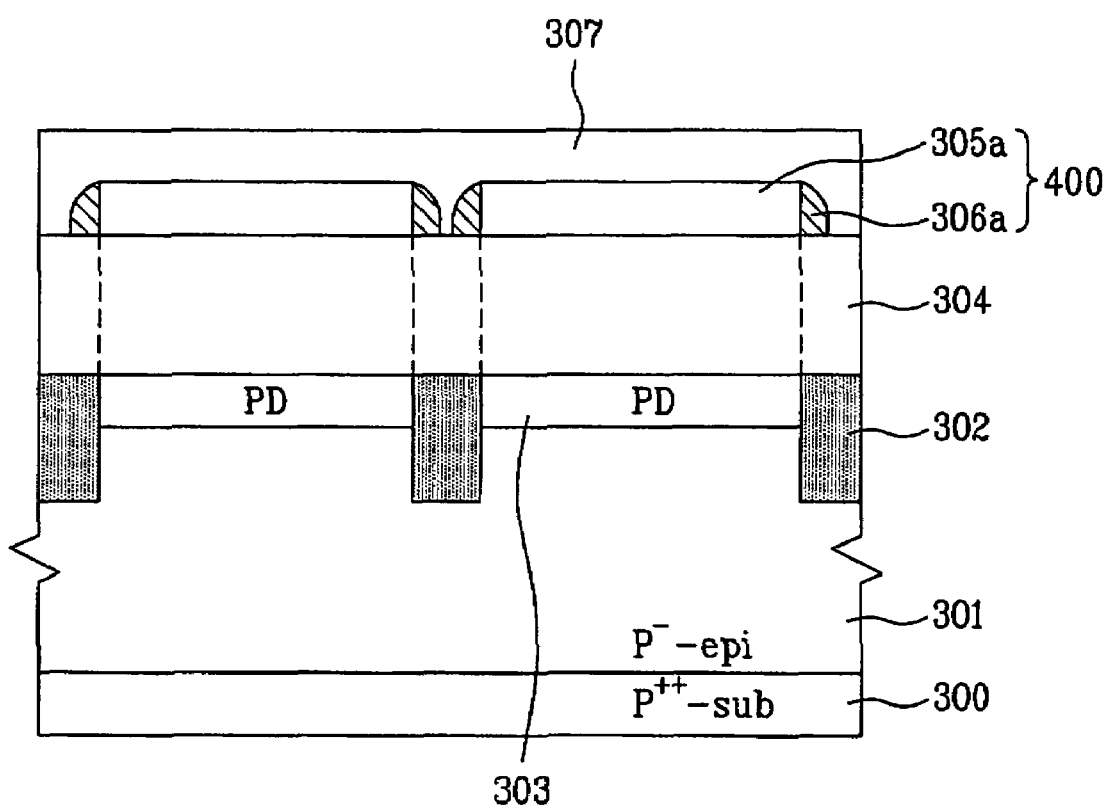

Referring to FIG. 5C, the second dielectric film 306 is etched by dry etching, (e.g., by reactive ion etching (RIE) having an anisotropic etch characteristic), until the surface(s) of the first dielectric film pattern(s) 305a and the interlayer insulating film 304 are exposed. As a result, the second dielectric film pattern 306a is formed into sidewall spacer shapes located at sides of the first dielectric film pattern(s) 305a. Thus, a plurality of microlenses 400 each of which includes a first dielectric film pattern 305a and the adjacent sidewalls formed by the second dielectric film pattern 306a is formed.

In the illustrated example, it is preferable that the first dielectric film has an index of refraction in a range of about 1.3~1.7, and that the second dielectric film has an index of refraction in a range of about 1.8~2.2. Because the second dielectric film pattern 306a at the sides of the first dielectric film pattern 305a can refract light incident on regions other than on the upper portion of the first dielectric pattern 305a, (i.e., on regions other than the photo diode 303 region), such that the light is directed into a lower region of the first dielectric film pattern 305 and, ultimately, onto the photo diode region 303.

After the microlenses 400 (i.e., the first and second dielectric film patterns 305a, 306a) are formed, a third dielectric film 307 is formed on an entire surface of the resulting structure including on the microlenses 400. Preferably, the third dielectric film 307 is formed of a material having an index of refraction which is substantially the same as the index of refraction of the first dielectric film to allow light passed through the third dielectric film 307 to be received in the first dielectric film undisturbed. It is preferable that the interlayer insulating film 304 and the third dielectric film 307 have substantially the same index of refraction.

Figure 5D:
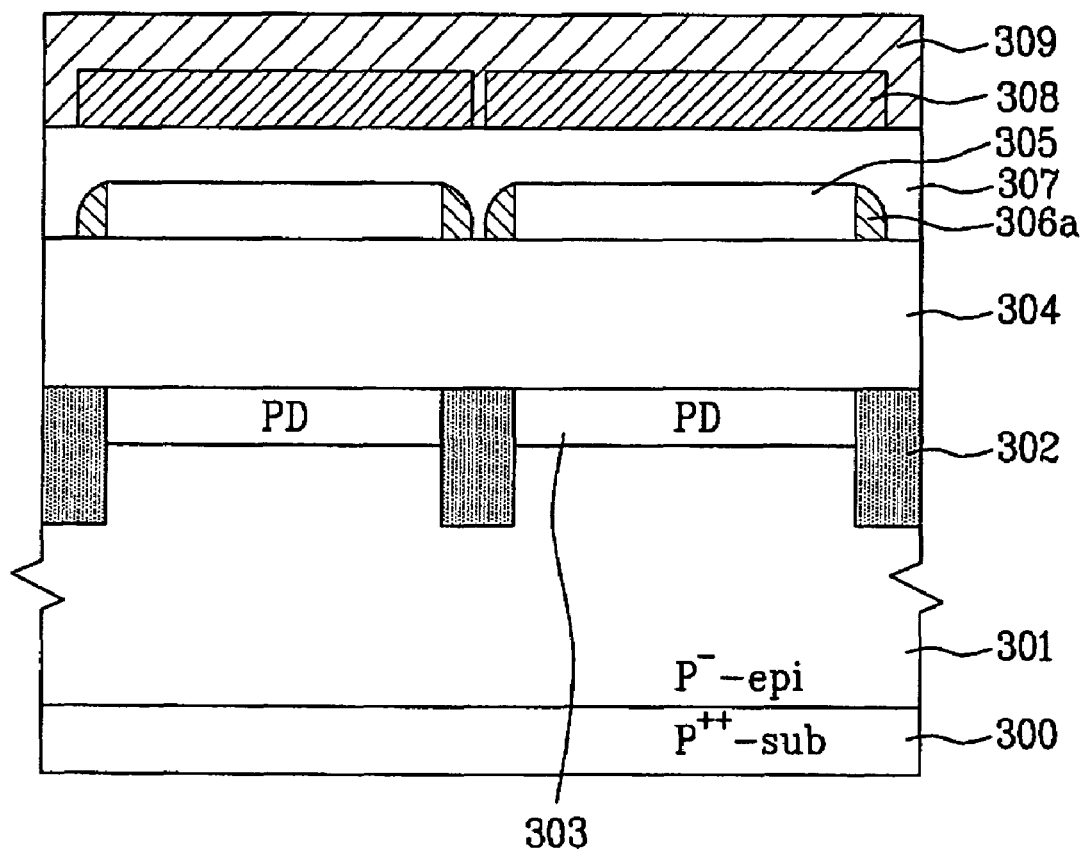

Referring to FIG. 5D, red (R), green (G), and/or blue (B) color filter layers 308 are formed on the third dielectric film 307 above respective ones of the photo diodes. The color filter layer 308 allow light of a particular wavelength to pass to their respective photo diodes 303 via their respective microlenses 400. An over coat layer 309 is formed on the entire surface of the resulting structure, including on the color filter layers 308.

Figure 6:
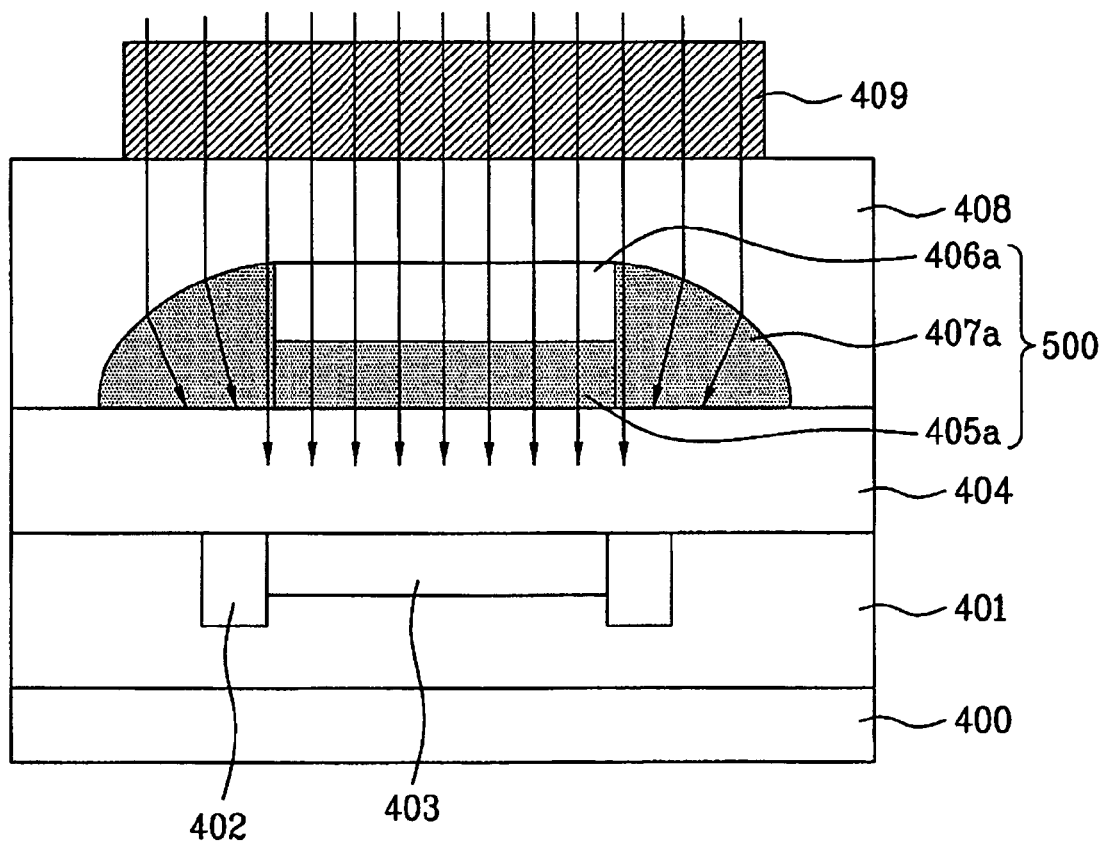
FIG. 6 is a cross-sectional view of a second CMOS image sensor constructed in accordance with the teachings of the present invention.

FIG. 6 is a cross-sectional view of another example CMOS image sensor constructed in accordance with the teachings of the present invention. FIGS. 7A to 7E are cross-sectional views illustrating an example method for fabricating the CMOS image sensor of FIG. 6. Persons of ordinary skill in the art will appreciate that, although only one photo diode and microlens structure is shown in FIGS. 6 and 7A-7E, multiple photo diodes and multiple microlenses will typically be formed.

Referring to FIG. 6, the illustrated CMOS image sensor includes a P type epitaxial layer 401 formed on a semiconductor substrate 400. An active region is defined in the epitaxial layer 401 by a device isolating film 402. A light receiving device 403 (i.e., a photo diode), is formed in a predetermined region of the active region.

An interlayer insulating film 404 is formed on the entire surface of the epitaxial layer 401. A microlens 500 is formed on the interlayer insulating film 404 over the photo diode 403. The microlens 500 comprises a first dielectric film pattern 405a, a second dielectric film pattern 406a, and a third dielectric pattern 407a.

In the illustrated example, the first dielectric film pattern 405a and the second dielectric pattern 406a are stacked in succession on the same area as the photo diode 403. The third dielectric film pattern 407a is formed at the sides of the first and second dielectric film patterns 405a, 406a in the shape of sidewall spacers. The first and third dielectric film patterns 405a, 407a are formed of a material having a higher index of refraction than the second dielectric film pattern 406a. The first and third dielectric film patterns 405a, 407a have substantially the same refractive index.

Since the spacer shaped third dielectric film pattern 407a has a higher index of refraction than the second dielectric film pattern 406a, and since the spacer shaped third dielectric film pattern 407a is formed on a region outside of the photo diode 403, the third dielectric film pattern 407a enables the microlens 400 to collect more light and, thus, to have an improved light focusing power.

A fourth dielectric film 408 is formed on the entire upper surface of the resulting structure (including on the microlens 500). It is preferable that the second and fourth dielectric films 406a, 408, and the interlayer insulating film 404 have the same index of refraction.

A color filter layer 409 is formed on the fourth dielectric film 408 over the photo diode 403. An over coat layer (not shown) is formed on the fourth dielectric film 408 and on the color filter layer 409.

Figure 7A:
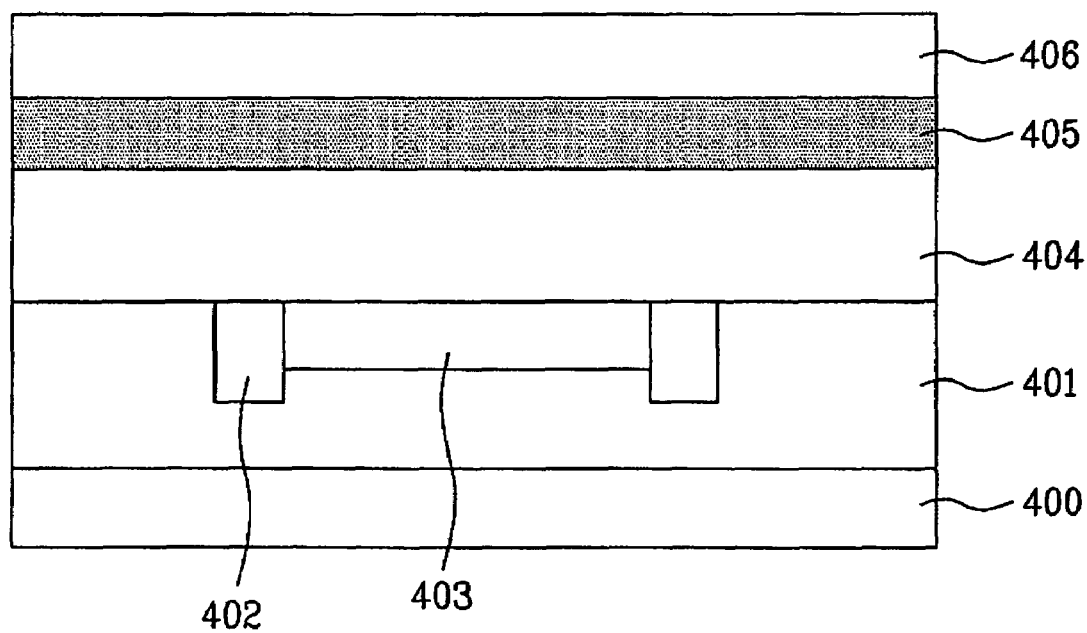
FIGS. 7A to 7E are cross-sectional views illustrating another example method for fabricating a CMOS image sensor performed in accordance with the teachings of the present invention.

A method of fabricating the CMOS image sensor of FIG. 6 will now be described. Referring to FIG. 7A, a semiconductor substrate (for example, a p type single crystal silicon substrate) 400 is provided. A p type epitaxial layer 401 is formed on the semiconductor substrate 400. The p type epitaxial layer 401 will form a large and deep depletion region in a low voltage photo diode to be formed later, so as to enhance the capability of the photo diode to collect photo-charges and, thus, improve the photo sensitivity of the photo diode.

An active region and a field region are defined in the epitaxial layer 401 by a device isolating film 402. 'N' type impurity ions are injected into a predetermined portion of the epitaxial layer 401 in the active region to form the photo diode 403.

An interlayer insulating film 404 is formed on the entire surface of the epitaxial layer 401 (including on the photo diode 403). Then, although not shown, a light shielding layer may be formed on the interlayer insulating film 404 to block light incident on regions other than the photo diode 403.

A first dielectric film 405 and a second dielectric film 406 are successively formed on the interlayer insulating film 404. Preferably, each of the first dielectric film 405 and the second dielectric film 406 are formed to a thickness in a range of about 5000~15000 Å. It is also preferable to form the first dielectric film 405 of a material having a higher index of refraction than the second dielectric film 406 and the interlayer insulating film 404. Preferably, if the interlayer insulating film 404 and the second dielectric film 406 are formed of oxide, the first dielectric film 405 is formed of nitride. The thickness of each of the first and second dielectric films 405, 406 is not limited to the above, but rather, these thicknesses are adjustable according to the desired characteristics of the device.

Figure 7B:
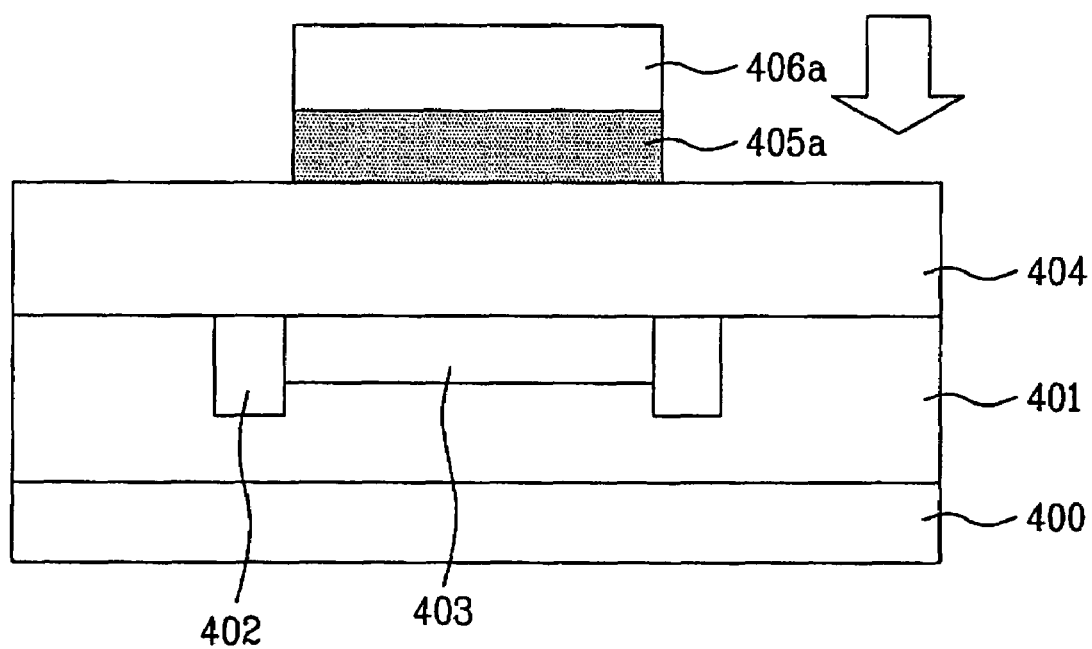

Referring to FIG. 7B, the first dielectric film 405 and the second dielectric film 406 are selectively patterned by photolithography and etching to form first and dielectric film patterns 405a, 406a on the interlayer insulating film 404 over the photo diode 403. (Of course, where multiple photo diodes 403 are employed, a plurality of first and second dielectric film patterns 405a, 406a are formed on the interlayer insulating film 404 over the photo diode 403. In other words, the first and second dielectric film patterns 405a, 406a are formed such that the first and second dielectric films 405, 406 remain on regions over the photo diodes 403, while other portions of the first and second dielectric films 405, 406 are removed).

In the illustrated example, the first and second dielectric film patterns 405a, 406a are formed so as to be in conformity with the photo diode regions. More specifically, it is preferable that the first and second dielectric film patterns 405a, 406a have a width in a range of about 0.5~2 μm.

Figure 7C:
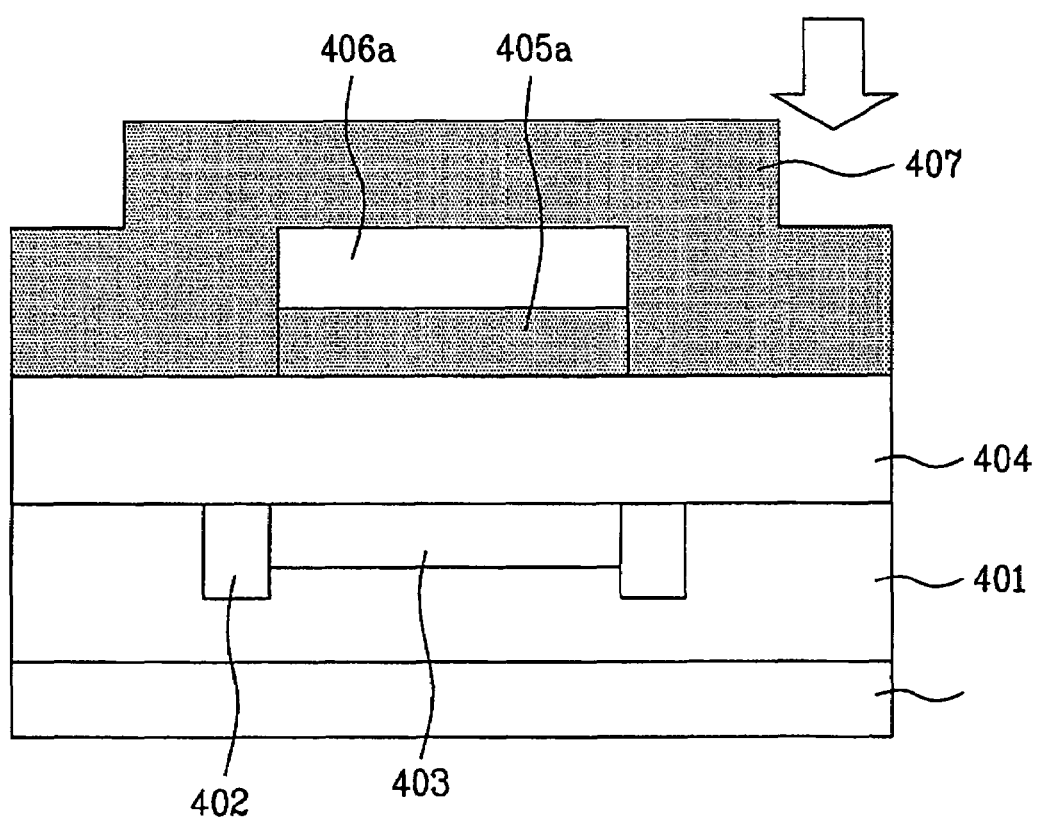

Referring to FIG. 7C, a third dielectric film 407 is formed on the entire surface of the structure of FIG. 7B (including on the first and second dielectric film patterns 405a, 406a) to a thickness in a range of about 10000~30000 Å. Of course, the thickness of the third dielectric film 407 is also not limited to the above, but is instead adjustable to suit the application. The third dielectric film 407 is formed of a material having substantially the same index of refraction as the first dielectric film pattern 405a.

Figure 7D:
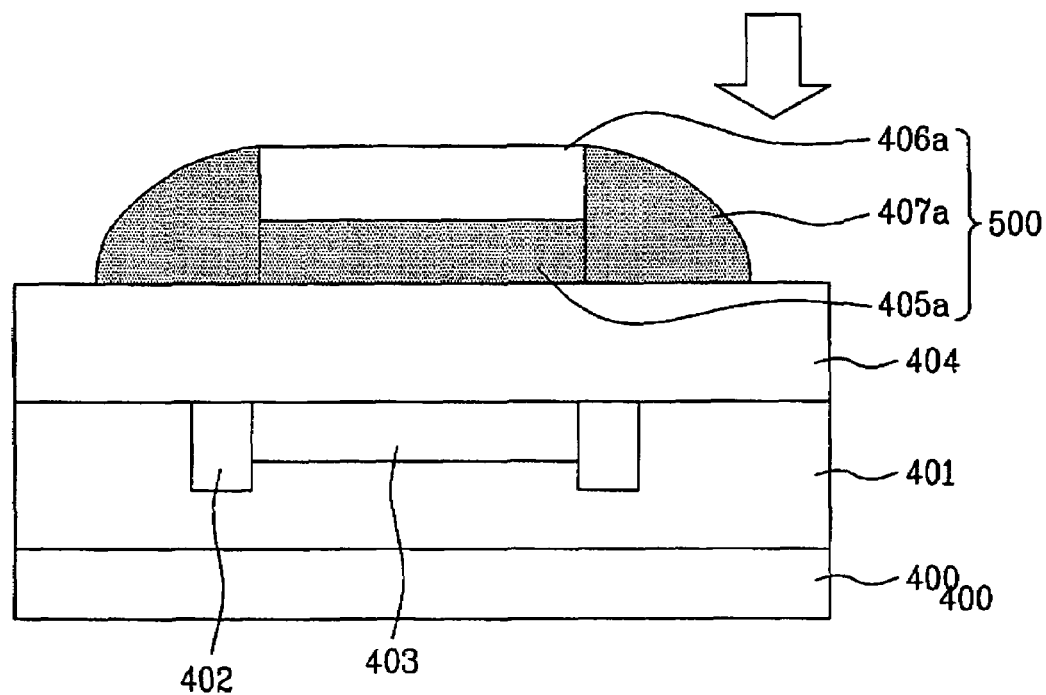

Referring to FIG. 7D, the third dielectric film 407 is etched by dry etching (e.g., by reactive ion etching (RIE) having an anisotropic etch characteristic) until a surface of the second dielectric film pattern 406a and a surface of the interlayer insulating film 404 are exposed. As a result, a sidewall spacer shaped third dielectric film pattern 407a is formed on the sides of the first and second dielectric film patterns 405a, 406a. Thus, a microlens 500 comprising the first, second, and third dielectric film patterns 405a, 406a, and 407a is formed.

In the illustrated example, it is preferable that the first and third dielectric film patterns 405a, 407a have an index of refraction in a range of about 1.8~2.2. It is also preferable that the second dielectric film has an index of refraction in a range of about 1.3~1.7.

Figure 7E:
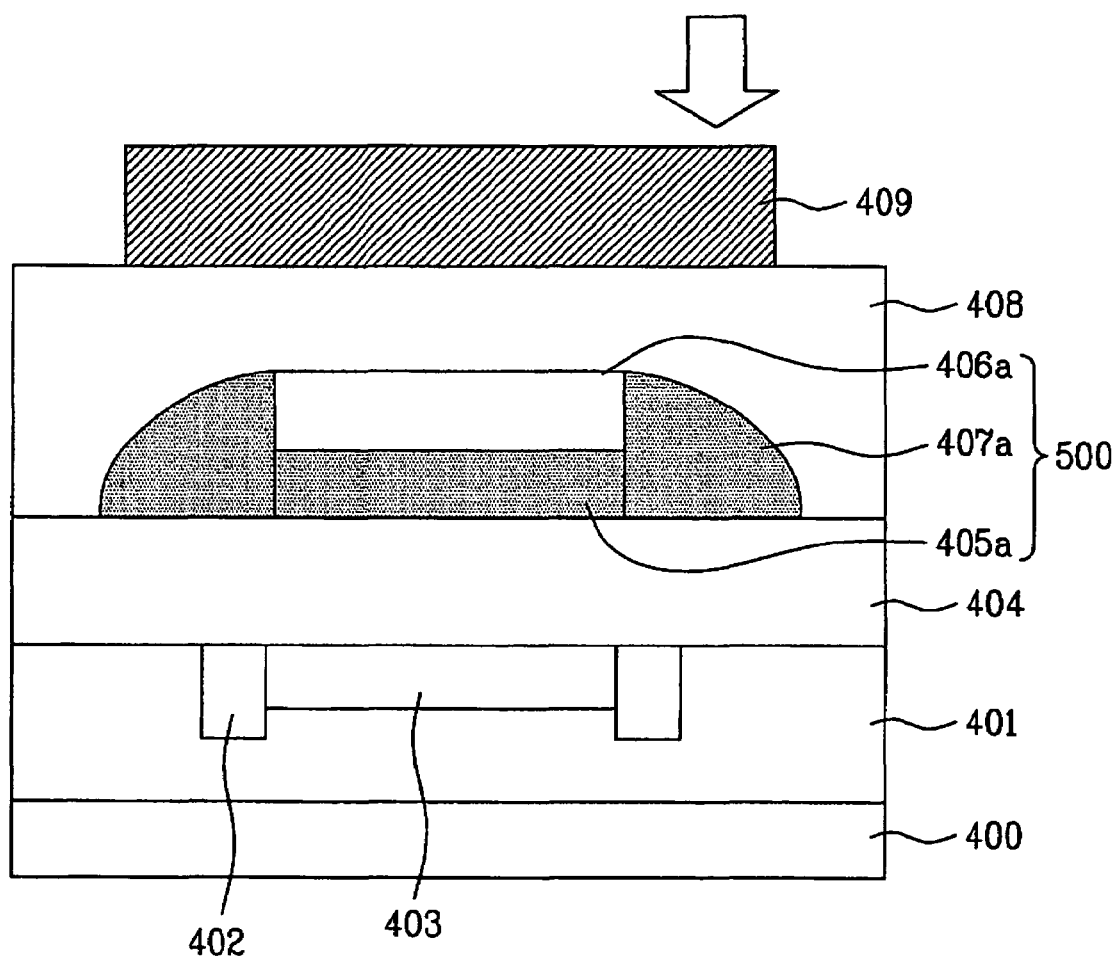

Referring to FIG. 7E, after the microlens 500 is formed, a fourth dielectric film 408 is formed on the entire surface of the structure of FIG. 7D (including on the microlens 500). Preferably, the fourth dielectric film 408 is formed of a material having substantially the same index of refraction as the second dielectric film pattern 406a.

Next, red (R), green (G), and/or blue (B) color filter layers 409 are formed on the fourth dielectric film 408 over respective ones of the photo diodes 403. Each color filter layer 409 allows light of a particular wavelength to reach its respective photo diode 403 via the microlens 500. Next, an over coat layer (not shown) is formed on the entire surface of the structure of FIG. 7E (including on the color filter layer 409) to complete the fabrication of the CMOS image sensor.

Unlike the first example, the second example CMOS image sensor has the additional first dielectric film pattern 405a. Although the first dielectric film 405a may reduce the transmittivity of light, the first dielectric film pattern 405a (preferably of silicon nitride) can reduce leakage current. The drop of transmittivity is minimal.

From the foregoing, persons of ordinary skill in the art will appreciate that the above disclosed CMOS image sensors and methods for fabricating the same have several advantages. For instance, in the first example sensor, the microlens 400 is a combination of the first dielectric film pattern 305a having the shape of the photo diode 303, and the second dielectric film pattern 306 a located at sidewalls of the first dielectric film pattern 305a. The refractive index of the second dielectric film 306a is higher than the refractive index of the first dielectric film 305a. Accordingly, light incident on the portion of the microlens over the photo diode is focused onto the photo diode owing to the characteristics of the light traveling in a straight line, and light incident on regions of the microlens outside of the photo diode 303 are also focused onto the photo diode owing to the refractive index of the second dielectric film 306a. Therefore, the focusing power of the microlens is improved relative to the prior art.

In the second example described above, the refractive indices of the first and third dielectric film patterns are higher than the refractive indices of the second and fourth dielectric films. As a result, since the light incident on a portion of the microlens 500 over the photo diode 403 is focused onto the photo diode 403, and light incident on regions outside of the photo diode 403 are also focused onto the photo diode 403 owing to the refractive index of the third dielectric film 407a, the focusing power of the microlens 500 is improved relative to the prior art.

Further, since the first, second, third, and fourth dielectric films can be formed in a high temperature process, high temperature processes may be carried out after formation of the microlens. In addition, since the microlens is formed before the color filter layer, the distance between the photodiode and the microlens is reduced. As a result, the focusing power of the microlens is improved relative to the prior art.

Moreover, in the second example, the center portion (i.e., the first dielectric material) and the edge portion (i.e., the third dielectric material) of the microlens is formed of silicon nitride having a relatively high index of refraction. As a result, device leakage current is reduced due to the high $H_2$ content of the silicon nitride film.

In view of the foregoing, persons of ordinary skill in the art will appreciate that CMOS image sensors and a methods for fabricating the same have been disclosed. In the disclosed examples, a microlens is formed not by baking a photoresist film, but by etching a dielectric film. As a result, the microlens has strong focusing power.

A disclosed example CMOS image sensor includes a semiconductor substrate having a photo diode, an interlayer insulating film on the semiconductor substrate, a microlens including a first dielectric film located on the interlayer insulating film over the photo diode and a second dielectric film located at sidewalls of the first dielectric film pattern, and a third dielectric film on the interlayer insulating film and the microlens.

Another disclosed example CMOS image sensor comprises a semiconductor substrate having a photo diode, an interlayer insulating film on the semiconductor substrate, a microlens including a first and second dielectric films located on the interlayer insulating film over the photo diode and a third dielectric film at sidewalls of the first and second dielectric films, and a fourth dielectric film on the interlayer insulating film and on the microlens.

A disclosed example method for fabricating a CMOS image sensor comprises injecting impurity ions into a predetermined region of a semiconductor substrate to form a photo diode, forming an interlayer insulating film on the semiconductor substrate, forming a first dielectric film on the interlayer insulating film over the photo diode, forming a second dielectric film at four sidewalls of the first dielectric film to form a microlens comprising the first and second dielectric films, and forming a third dielectric film on the interlayer insulating film and on the microlens.

In another disclosed example method for fabricating a CMOS image sensor comprises injecting impurity ions into a predetermined region of a semiconductor substrate to form a photo diode, forming an interlayer insulating film on the semiconductor substrate, successively forming first and second dielectric films on the interlayer insulating film and patterning the first, and second dielectric films such that the first and second dielectric films remain on the interlayer insulating film over the photo diode, forming a third dielectric film at the sidewalls of the first and second dielectric films to form a microlens including the first and second dielectric films, and forming a fourth dielectric film on the interlayer insulating film and on the microlens.

It is noted that this patent claims priority from Korean Patent Application Serial Number P2003-0101545, which was filed on Dec. 31, 2003, and Korean Patent Application Serial Number P2004-0063466, which was filed on Aug. 12, 2004, both of which are hereby incorporated by reference in their entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A CMOS image sensor comprising:
   a semiconductor substrate;
   a photodiode on the semiconductor substrate;
   an insulating film on the semiconductor substrate, over the photodiode;
   a microlens that is wider than the photodiode, comprising:
   i) a first dielectric film on the insulating film and over the photodiode, the first dielectric film having a first refractive index;
   ii) a second dielectric directly film on the first dielectric film, the second dielectric film having a second refractive index lower than the first refractive index; and
   iii) a sidewall dielectric film directly on at sidewalls of each of the first and second dielectric films and on the insulating film, the sidewall dielectric film having a curved outer surface and a refractive index equal to the first refractive index; and
   a fourth dielectric film on the insulating film and on the microlens.

2. A CMOS image sensor as claimed in claim 1, wherein the first index of refraction is higher than an index of refraction of the second and fourth dielectric film.

3. A CMOS image sensor as claimed in claim 1, wherein the indices of refraction of the first dielectric and sidewall dielectric films are about 1.8~2.2, and the indices of refraction of the second and fourth dielectric films are about 1.3~1.7.

4. A CMOS image sensor as claimed in claim 1, wherein widths of the first and second dielectric films are substantially identical to a width of the photodiode.

5. A CMOS image sensor as claimed in claim 1, wherein the first dielectric and sidewall dielectric films comprise nitride films.

6. A CMOS image sensor as claimed in claim 1, further comprising a color filter layer located on the fourth dielectric film over the photodiode.

7. A CMOS image sensor as claimed in claim 1, wherein the photodiode is in an epitaxial layer on the substrate.

8. A CMOS image sensor as claimed in claim 7, further comprising a device isolation layer in the epitaxial layer and adjacent to the photodiode.

9. A CMOS image sensor as claimed in claim 4, wherein the width of each of the first and second dielectric films are about 05~2 μm.

10. A CMOS image sensor as claimed in claim 7, further comprising a depletion region in the epitaxial layer.

11. A CMOS image sensor as claimed in claim 1, wherein the insulating film comprises a light shielding layer.

12. A CMOS image sensor as claimed in claim 7, wherein the photodiode comprises a region of the epitaxial layer containing N-type impurity ions.

13. A CMOS image sensor as claimed in claim 1, wherein the first dielectric film has a thickness of about 5,000~15,000 Å.

14. A CMOS image sensor as claimed in claim 1, wherein the second dielectric film has a thickness of about 5,000~15,000 Å.

15. A CMOS image sensor as claimed in claim 1, wherein the sidewall dielectric film forms a sidewall spacer at the sidewalls of the first and second dielectric films.

16. A CMOS image sensor as claimed in claim 15, wherein the sidewall dielectric film has a thickness at an interface wit the sidewalls of the first and second dielectric films about equal to a combined thickness of the first and second dielectric films.

17. A CMOS image sensor as claimed in claim 7, wherein the first and second dielectric films are substantially aligned with the underlying photodiode, and substantially all of the sidewall dielectric film is over the area of the epitaxial layer that is lateral to die photodiode and surrounds the photodiode.

18. A CMOS image sensor as claimed in claim 1, wherein the second and fourth dielectric films each comprise an oxide film.

19. A CMOS image sensor as claimed in claim 1, wherein the insulating layer comprises an oxide film.

20. A CMOS image sensor as claimed in claim 6, wherein the color filter layer is over the first and second dielectric layers and at least a portion of the sidewall dielectric layer.

* * * * *